United States Patent
Dyer

(10) Patent No.: US 6,288,357 B1
(45) Date of Patent: Sep. 11, 2001

(54) ION MILLING PLANARIZATION OF SEMICONDUCTOR WORKPIECES

(75) Inventor: Timothy S. Dyer, Tempe, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/501,702

(22) Filed: Feb. 10, 2000

(51) Int. Cl.[7] .................................................. B23K 10/00
(52) U.S. Cl. ............................ 219/121.41; 219/121.42; 219/121.43; 219/121.35; 204/192.34; 204/298.36; 156/345; 156/646.1; 250/492.21; 438/712; 438/697; 216/67; 216/66
(58) Field of Search ....................... 219/121.43, 121.4, 219/121.41, 121.42, 121.35; 204/192.34, 298.36; 216/67, 66; 156/345, 643.1, 646.1; 250/492.21; 438/631, 633, 712, 716, 697

(56) References Cited

U.S. PATENT DOCUMENTS

| | | | |
|---|---|---|---|
| 4,806,829 | * 2/1989 | Nakao | 315/111.81 |
| 4,874,459 | * 10/1989 | Coldren et al. | 156/643.1 |
| 5,744,400 | 4/1998 | Dyer . | |
| 6,013,191 | * 1/2000 | Nasser-Faili et al. | 216/67 |
| 6,042,738 | * 3/2000 | Casey, Jr. et al. | 216/66 |

* cited by examiner

Primary Examiner—Mark Paschall
(74) Attorney, Agent, or Firm—Snell & Wilmer, L.L.P.

(57) ABSTRACT

A method and apparatus is presented for planarizing or polishing workpiece surfaces using an ion beam in the presence of a radio frequency generated plasma. A workpiece is placed in a holder within a vacuum chamber equipped with a radio frequency inductive plasma generator. The workpiece surface is exposed to a source of energetic ions, the chamber is filled with gas, and the gas is ionized with radio frequency energy to form inductive plasma that surrounds the workpiece. An ion beam mounted above the workpiece scans the workpiece surface with sufficient energy to remove micro irregularities from the workpiece surface.

13 Claims, 3 Drawing Sheets

ION MILLING PLANARIZATION OF SEMICONDUCTOR WORKPIECES

BACKGROUND OF THE INVENTION

1. Field of Invention

The present invention relates generally to a method and apparatus for smoothing surfaces having fine irregularities, of the order of a few microns and up to about 200 microns in size. In particular, the method and apparatus of the invention is useful in planarizing or polishing the surfaces of semiconductor wafers, precision optical lenses and the like using an ion beam in the presence of a radio frequency generated plasma.

2. Description of The Related Art

With advances in technology, there is increasingly a demand, in certain technologies, for precision planarization or polishing of surfaces for a variety of purposes. For example, highly polished precision surfaces are needed in optics and in the fabrication of semiconductors, using silicon wafers. Indeed, as explained below, requirements in the two technical fields are frequently interrelated, in that optical instruments are used in the manufacture of semiconductors.

The fabrication of very large scale integrated circuits on silicon wafers is a process requiring extreme precision because of the very fine details of the circuits. Indeed, the width of circuit lines are continually decreasing as the technology advances, and is now in the range of 0.18–100 microns. Since the circuits are produced using photolithographic techniques, extremely accurately ground lenses are required to provide fine detail. As a necessary consequence of providing such precise focusing, the lenses lack depth of field, i.e., an image is accurately produced only at a specific distance from the lens, and any deviation in this distance produces an increasingly unfocused or fuzzy image. Therefore, the surface onto which the image is projected must be as perfectly planar as possible to eliminate out-of-focus image fuzziness. A failure to maintain planarity exacerbates the problem as additional layers are formed on the nonplanar surface resulting in an increased proportion of defective semiconductors that must be rejected.

At present, the standard technique for restoring surface planarity, after certain processes that lay down component layers on the wafer, is chemical mechanical planarization (CMP). During this process, the surface of the wafer is polished with a polishing pad, and in certain instances with a chemical slurry, to remove excess material and also to replanarize the surface. When a slurry is used, it contains an abrasive, such as silica or alumina, and chemical additives that are designed to selectively react with and soften the composition of those components that must be planarized or removed from the wafer surface. Chemical slurries are not always used, and certain planarization and polishing steps may be carried out using a "fixed abrasive" in which an abrasive substance or composition is fixed in a polishing pad or other substrate that is used to polish the wafer surface.

SUMMARY OF THE INVENTION

This summary of invention section is intended to introduce the reader to aspects of the invention and is not a complete description of the invention. Particular aspects of the invention are pointed out in other sections hereinbelow, and the invention is set forth in the appended claims which alone demarcate its scope.

The invention provides a method of planarizing a surface of a substrate that has micro irregularities using an ion beam of suitable energy, while the surface of the substrate is energized with radio frequency generated plasma. The technique of the invention may be applied to a wide range of substrates, including semiconductor wafers (as a substitute for chemical mechanical polishing), hard disk fabrication (for computers), optical lenses, and other devices that require exceptionally accurately planarized or smoothed surfaces.

In accordance with one aspect of the method of the invention, a substrate is placed in a holder in a vacuum chamber equipped with a radio frequency inductive plasma generator. The surface to be polished or planarized is exposed to a source of energetic ions, such as an ion gun. The chamber is filled with a gas, and the gas is ionized with radio frequency energy to form inductive plasma that surround the substrate. An ion beam is mounted above the substrate and directed to scan the surface of the substrate that must be polished or planarized. The ion beam is selected to have sufficient energy to remove surface micro irregularities from the surface of the substrate. Preferably, the ion beam milled surface is scanned and inspected for surface smoothness characteristics. When a predetermined surface smoothness characteristic has been achieved, the ion beam milling is discontinued.

The method of the invention eliminates the need for chemical mechanical planarization, and provides a method of achieving surface smoothness and planarization, without generation of hazardous waste for disposal. Moreover, the method is exceptionally well suited to automation, and may be carried out at high speed resulting in a high throughput of polished substrates. Further, the technique is flexible in that an appropriate selection of ion beam energy and plasma may be custom tailored for a particular substrate. Accordingly, the invention provides many advantages over prior art techniques, such as chemical mechanical polishing.

BRIEF DESCRIPTION OF THE DRAWINGS

The following drawings are illustrative of embodiments of the invention and therefore do not limit the scope of the invention, but are presented to assist in providing a proper understanding of the invention. The drawings are not to scale, and are intended for use in conjunction with the explanations in the following detailed description section.

DETAILED DESCRIPTION OF THE PREFERRED EMBODIMENTS

This section describes aspects of the invention, and points out certain preferred embodiments of these aspects. This section is not intended to be exhaustive, but rather to inform and teach the person of skill in the art who will come to appreciate more fully other aspects, equivalents, and possibilities presented by the invention, and hence the scope of the invention as set forth in the claims which alone limit its scope.

The method of the invention may be applied to any of a variety of substrates that must be treated to provide a smooth surface, whether planar or not. The method is best suited for application to surfaces that contain "micro irregularities", so that these irregularities may be selectively eliminated or reduced in size, as required.

In accordance with the specifications and claims, the term "micro irregularities" refers to irregularities of the order of magnitude found on the surface of semiconductor wafers that are undergoing treatment to form semiconductors thereon, and that must ordinarily subjected to chemical mechanical polishing (or other polishing treatment) to replanarize the wafer surface (or to polish off surface features) in order to produce useful semiconductor devices. Accordingly, the micro irregularities are ordinarily in the micron size range, ranging from about 0.15 to about 200 microns in size, with varied pitch and density.

In accordance with the invention, micro irregularities are reduced or eliminated by immersing the substrate in a radio frequency generated plasma, and milling the substrate surface with an ion beam of suitable energy. While planarization of the surface is desirable in certain circumstances, for instance when a semiconductor is undergoing ion beam milling of its surface, in other circumstances the ion beam may be used to produce a nonplanar surface, for example when an optical surface is being treated to improve smoothness, but to maintain an optically correct curvature.

Figure 1:
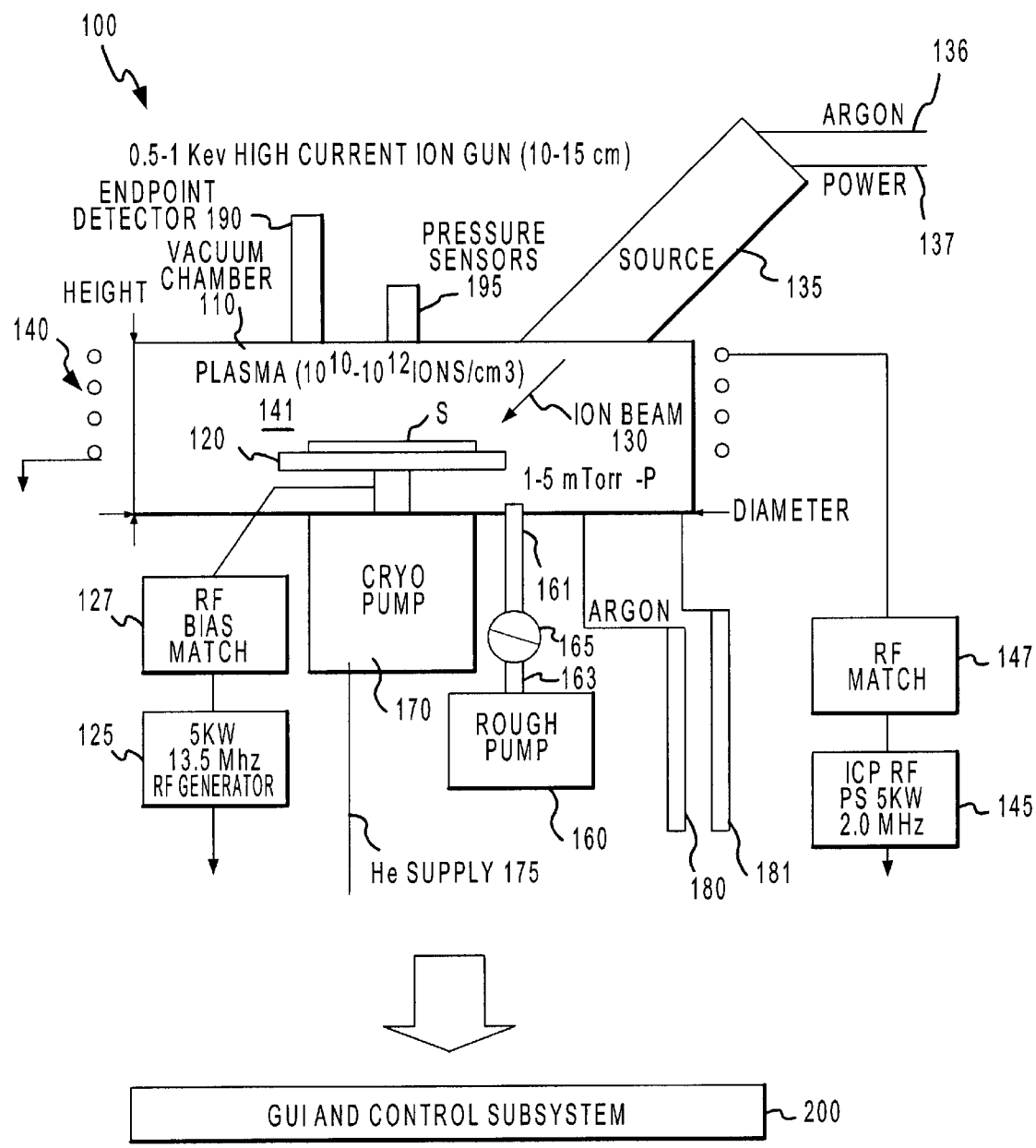
FIG. 1 is schematic view of an ion beam planarization apparatus useful in an embodiment of the method of the invention.

An embodiment of a suitable radio frequency plasma ion beam milling apparatus is illustrated in FIG. 1. The apparatus 100 includes a vacuum chamber 110 that may be constructed of any suitable material, such as stainless steel or aluminum. In certain instances, it may be desirable to line the interior of the chamber with a non-reactive substance, such as a ceramic or quartz. The chamber should be sized to contain the substrate S without restricting the flow of gas or plasma around the substrate S surface. In the case of treatment of a semiconductor wafer, the chamber 110 is preferably cylindrical with a diameter in the range from about 12 to about 20 inches, and a height in the range from about 5 to about 25 inches.

The substrate S is supported and preferably held fixedly in the chamber by an electrostatic chuck 120, or a holder of another type, dependent upon the nature of the substrate being milled. If the holder 120 may allow for rotational or translational movement of the substrate S with respect to the chamber 110, or an ion beam 130 emitted from an ion beam source 135. As indicated, the ion beam source should be located relative to the holder 120 so that the ion beam 130 may be directed to scan the surface of the substrate to be milled by the beam.

In the event that the substrate S is a semiconductor wafer, then holder 120 is preferably an electrostatic chuck that is driven by a power generator subsystem 125 of the apparatus, through a bias matching subsystem 127. The bias system 127 provides an efficient transfer of power from the radio frequency power generator 125 to the chuck 120. In a preferred embodiment, where a semiconductor wafer is being milled, generator 125 preferably has a power production capacity of at least about 5 kilowatts at an oscillation frequency of about 2.0 to about 13.5 MHz.

The vacuum chamber 110 is in fluid communication with the inlet of a roughing pump 160 through conduit 162 equipped with a vacuum valve 165. Preferably, pump 160 is a "dry scroll pump", however, any other type of oil-free pump may also be used. Preferably, conduit 162 and vacuum valve 165 are heated to reduce any buildup of contamination from gaseous products produced during the milling process. Additional vacuum pumping to remove gaseous materials formed during the milling process is applied by a high vacuum pump 170. The high vacuum pump may be selected from those commonly used for such purposes, for example, turbo pumps, molecular drag pumps, or ion pumps. Most preferably, high vacuum pump 170 is a cryopump.

Preferably, the pumps 160 and 170, as well as the vacuum chamber 110, are supplied with pressure gauges and transducers (for example, ion gauges, cold cathode gauges, capacitance manometers, Pirani gauges) for monitoring purposes.

The vacuum chamber 110 is surrounded by a radio frequency antenna 140. The antenna 140 is powered by a radio frequency power generator subsystem 145, that routes power to the antenna via a radio frequency bias matching subsystem 147. The bias subsystem 147 provides a high efficiency power transfer from the power generator 145 to the antenna 140. Once antenna 140 is energized, it excites gases within vacuum chamber 110 to create a plasma.

Generator 145 preferably has a power production capacity of at least about five kilowatts and an oscillation frequency of about 2.0 megahertz. RF power supplies use federally mandated frequencies set by the U.S. Federal Communications Commission (FCC) that are allowed for equipment usage. For this application, 1.8, 2.0, 8.0, and 13.5 MHz are the best frequencies to use although others may also be useful. Higher frequencies than 13.5 MHz are not recommended in vacuum equipment, and may slow down the etching process. As for power requirements, the inductive plasma subsystem (RF coil around the system) should preferably be powered by a 3–5 KW RF generator for a 200 mm wafer. Power will scale proportionally to the wafer surface area, therefore a 300 mm system would require about 6 to about 10 KW. All frequencies listed above can be used for the inductive coil or wafer pedestal/support. The wafer support platform should be electrically isolated from the rest of the system. Power requirements and scaling for the wafer support are similar to that of the RF antenna. ENI of Rochester, N.Y. makes suitable power supplies although others are also useful. These power supplies are designed to power a reactive load of 50 ohms. An active or passive impedance matching network should be placed in-between the process chamber and the power supply to effectively couple the power.

In a preferred embodiment of the invention, when the substrate S is a semiconductor wafer, the gas supplied into chamber 110 is argon. However, the invention is not limited to the use of argon gas and any one of krypton and helium may also be used. The transport of gas into the chamber 110 is from gas supply bottle 180 through conduit 182 supplied with mass flow regulating valve 184. Methods for controlling gas mass flow, pressure and other variables are well known in the art.

As shown in FIG. 1, chamber 110 is equipped with an ion beam source 135, that generates an ion beam 130, able to scan the surface of substrate S. Ion beam source 135 is preferably a high current source with a beam current greater than about 1,000 milliamps, and an adjustable energy within the range from about 100 to about 2,000 electron volts. (eV). Moreover, source 135 preferably has a spot size (beam diameter) within the range from about 15 to about 30 centimeters, depending upon the nature of the substrate to which the beam must be applied. A preferred ion beam source 135 is commercially available from Commonwealth Scientific of Fremont, Calif., in particular, the radio frequency inductively coupled high current (1700 milliamps) source providing a 30 centimeter diameter spot size. This particular instrument also provides an adjustable energy range from about 50 to about 1,000 eV with both spacial and temporal uniform beam characteristics. This source permits the use of Commonwealth Scientific's OPTILIN® self-aligning ion optics components. Electrically, the source 135 acts as the system anode and is the current (ion) source. The wafer and the electrostatic chuck perform the role of the cathode, and receive current from the anode to thereby achieve etching and planarization of the wafer surface.

In order to operate the ion beam source 135, there must be a gas supply subsystem (not shown) of the ion beam gas 156, and an ion source power supply subsystem (not shown). Certain other gases may be supplied from individual subsystems for a variety of purposes. For example, gases may be introduced into the vacuum chamber 110 for purposes of chamber cleaning, purging, chemical etching, and other purposes. Ion beam etching can use reactive or non-reactive (noble) gasses or mixtures of these. Ar, Kr, and/or He can be accelerated towards the substrate to induce physical sputter-etching (molecular sand blasting), to act as the pressure equivalent in CMP. The kinetic energy of the impinging species can be adjusted in 2 ways. Kinetic energy is proportional to the mass of the impinging species. In addition, kinetic energy is also proportional to the acceleration voltage squared. This roughly correlates with material removal rates, however, too much voltage (>1 KeV) may result in substrate damage. In this application, Ion beam voltage and RF pedestal power (bias) regulate the velocity of the incoming ionized noble gasses. Other gasses can be used to add a chemical component to the reaction. These include, for example, $NF_3$, oxygen, and Freon® like $C_2F_6$ and $CF_4$ can be used independently or mixed to adjust the chemical component of the etch. For example, for wafer cleaning, a 10 mTorr $NF_3$ plasma (inductive only, no ion beam or pedestal bias) or a $CF_4:O_2$ (about 3:1 ratio) plasma can remove etch residues (20 to 50 sccm). Adding these chemicals to the sputter/planarization process in small amounts (less than 20 sccm) adds a chemical component to the etch. This chemical component makes the etch process more isotropic, however material removal rates will be increased substantially. Cleaning processes will likely be short in duration (less than 30 seconds).

In the embodiment. shown in FIG. 1, the apparatus includes an "endpoint detector" 190. The endpoint detector may be selected from a wide range of instruments useful for detecting either surface smoothness or surface planarization. A supplier of such instruments includes Verity Instruments of Carrollton, Tex. In a preferred embodiment, where the substrate S is a semiconductor wafer, the endpoint subsystem 190 is an optical system that monitors the condition, roughness, thickness, and other properties of the surface layer or film on the wafer during processing. Subsystem 190 may use reflectometric and/or ellipsometric optical techniques to monitor wafer surface conditions.

As an alternative, monitoring of the wafer surface may be conducted using absorption or transmission spectra of the gaseous planarization products within the vacuum chamber 110. During the polishing or planarization technique, specific chemical species that include substrate surface products are formed, and these may be monitored for a preselected criteria that defines the endpoint of the process. For example, when a surface layer has been removed, an underlying layer may be exposed to the ion beam and chemical species from this underlying layer would be detected, indicating that the covering layer had been removed.

Preferably, system control and user interface functions are provided by a graphical user interface and control subsystem 200. Subsystem 200 permits the user to input commands and responses to messages and other protocols from the system 100. The interface also presents system data (pressure readings, number of substrates, time, power measurements, etc.) in graphical and tabular formats, as required for a variety of other purposes. The control subsystem may be based on a conventional PC using Windows operating system, and using a custom designed software for interfacing with the users and directing the actions of the tool. Various robotic subsystems may be used to transport substrates to and from the vacuum chamber. Suitable robotic systems may be obtained from a variety of sources, for example, Yaskawa America, of Chandler, Ariz., and Brooks Automation of Santa Clara, Calif.

Figure 2:
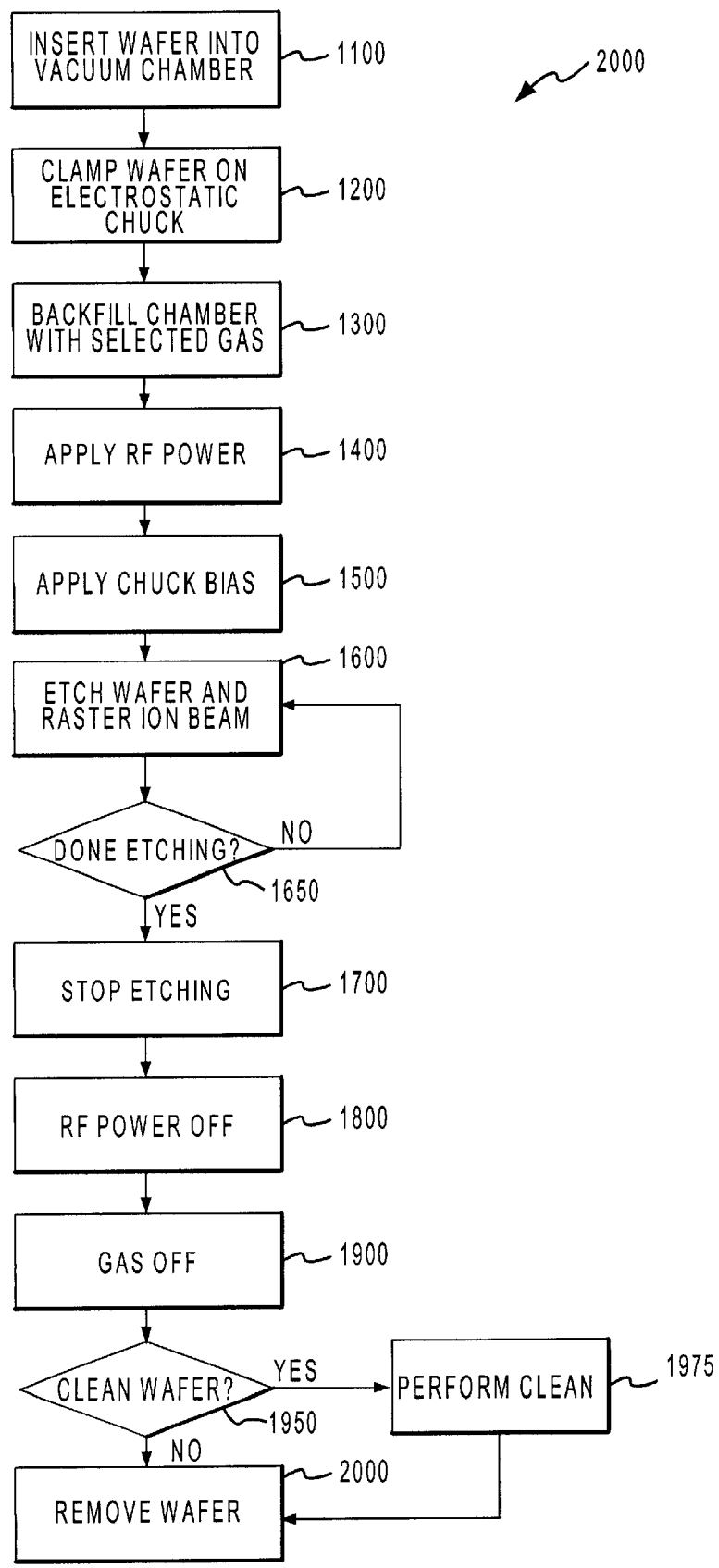
FIG. 2 is a flow chart of an embodiment of the inventive method of ion beam milling.

FIG. 2 is an example of a process flow chart of an embodiment of the invention. In a first step, a wafer is inserted into the vacuum chamber 1100. In the vacuum chamber, the wafer W is placed on an electrostatic chuck, in step 1200. The chamber is then backfilled with a selected plasma-forming gas, in step 1300. Preferably, the gas pressure within the chamber is in the range from about 0.1 to about 100 milliTorr, with the most preferred pressure in the range from about 1.0 to about 5.0 milliTorr. Once the backfilling gas stabilizes at the selected pressure, step 1400 is commenced, and power is supplied to the radio frequency antenna and the electrostatic chuck. The DC electrical bias of the chuck is preferably within the range from about −100 to about −2,000 volts, with respect to chamber ground or the chamber body. The chuck also preferably rotates at a rate within the range from about 5 to about 500 revolutions per minute. The radio frequency antenna generates ions at a density in the range of about $10^{10}$ to about $10^{12}$ ions per cubic centimeter, that suppresses the buildup of static electric charge on the wafer surface and reduces the possibility of device damage to the circuit features formed on the wafers, and the device, from such discharge.

In step 1600, the ion beam is used to etch the wafer surface, to remove or reduce micro irregularities. The ion beam milling system uses a radio frequency bias to accelerate ions produced by the ion beam source 135 into the wafer surface. This bias is established between the plasma generated by the radio frequency antenna 140, that surrounds an insulating cathode with an imbedded metal plate and functioning electrostatic chuck 120. Radio frequency energy accelerates the ions into the surface of the wafer W in a direction parallel to the current flow, and into the metal plate. RF induced field is directed into substrate at voltages of −800 to −1200 volts. RF current passes through the wafer, through the ESC, and into a large metal plate. This current flow is perpendicular to the wafer surface. The RF potential is an AC wave oscillating at the same frequency as the RF bias. the net RMS voltage of the wave relative to the reactor ground (body) will be about −700 to −1000 volts, which is often referred to as bias voltage in RIE etch systems.

This invention uses RF induced voltages over the wafer pedestal to assist in directing the incoming ions. Applying an RF signal to the cathode generates a potential relative to the reactor body (ground). This is due to the relatively faster motion of electrons in comparison with ions (charge balance across the "plasma sheath" must be maintained). In a vacuum electrons flow out quicker than ions come into the sheath and hit the substrate. This potential, and thickness of the sheath or "dark space" are a function of plasma density (the coil/inductive source provides this), system pressure, and pedestal RF input power. Increasing RF power to the wafer/pedestal/cathode results in higher voltages across the sheath in addition to more current flow. Voltage and current are coupled given a constant pressure/antenna power and range from 150 to 1400 volts (0.007 to 0.1 Amp/cm$^2$) with e-field perpendicular to the pedestal surface (across sheath covering the cathode). Generally, after a threshold voltage is achieved (about 50–100 eV), silicon dioxide will etch at a rate linearly proportional to the RF current passing through the wafer. Increasing the ion concentration by increasing the plasma density (more inductive RF power) may improve removal rates by offering more ions to the sheath (also reduces sheath potential). The effect of ion density is secondary to that of the sheath current in regards to etch rates.

It is theorized, without being bound, that as ions bombard the surface of the substrate or wafer, triangular facets appear on the surface. This surface morphology evolves as a result of sputter yields. These yields have rates that are energy and impart "angle of incidence" dependent (see attached yield vs. plot) Material is removed faster by ion impact methods when a glancing angle is used. Material removal rate increases as the beam is rotated off of normal and placed at a glancing angle to the substrate. Extreme glancing angles result in less removal of material from the substrate measured relative to the substrate surface. This is the angle of impact dependence of material sputtering rate. High features, relative to the lower features of wafer topography, will also be subjected to more lateral ion bombardment at glancing beam angles.

The highest sputter yields are about 45 degrees from the incident direction of the ion beam 130. As the surface features of the wafer are faceted, the ion beam is restart and focused by a system of lenses. Magnetic or electric lenses, or the DC bias applied between the plasma and the wafer surface direct the ion beam to sputter the evolving facets and form other facets on the crystalline, or polycrystalline, surface morphology of the wafer. It is theorized that radio frequency plasma inhibits charge buildup on the wafer surface, due to the wafer's low impedance and ability to transmit a charge. As the etching and rastering of the ion beam on the wafer surface continues, the typical material removal rate is from about 2,000 to about 5,000 amstroms per minute. Spot size, beam current, and wafer rotation speed affect removal rate.

The antenna provides the ions for the pedestal in addition to preventing anything on the wafer from charging. Antenna powers of about 3 to 5 KW should produce an adequate concentration of ions for the process of wafer cleaning. Charge on the wafer or in the reactor is undesirable since this can damage devices and/or alter the ion current flow in the system. Ions will be extracted from the inductive plasma and fired directly into the wafer surface via the RF power supplied to the cathode/wafer. Rounded micro irregularities or bumps will become jagged and square features on devices take on a faceted look. This will take about 1 minute to achieve globally across the wafer and is generated by the ion impact angle dependence of sputtering. Additional ions, fired from the rastering ion gun placed above the rotating substrate (about 30 degrees above the substrate), will contact the substrate at a different angle than the ions extracted from the ICP plasma. These ions will hit the substrate at about a 45 degree angle, knocking off the faceted peaks without etching deeply into the substrate (etch rate on peak tips will be at least about 5× that of the low areas). By tuning the ion gun voltage and sheath potential, one steers the ion impact angle into the substrate. If the sheath potential is 200 volts, for example, and the ion gun potential is 200 volts (30 degrees, or 173 volts along the wafer, and 100 normal to wafer), and the sheath is 200 volts normal to the wafer, this results in an impact angle of ($\tan^{-1}(400/173)$) or 66 degrees relative to the wafer plane. Adjusting either gun voltage or sheath voltage will change the ion impact angle of the ions coming from the gun. It is expected that most of the time the gun will be operated at voltages lower than about 500 volts to provide better ion steering capabilities. Dropping RF power to the pedestal would drop both sheath ion current and steering voltage (constant ion beam voltage). Similarly, ion beam current can be reduced to slow down the off angle ion etch rate. Either could tune up/down feature etch rates, thus altering selectivity and improving planarization rates. Etch non-uniformity could be controlled by substrate rotation rates and the beam raster pattern across the wafer. Throughout the process, the DC electrostatic chuck/cathode holds the wafer in place with a almost 0 amp current and about 1000 volt DC potential relative to the reactor body. The wafer is cooled by the water filled cathode. Helium can be introduced and trapped behind the wafer at pressures up to 5 Torr to enhance cooling.

As explained above, the process of material removal continues and is monitored by the endpoint subsystem 190. In step 1650, when the process is finished, the system proceeds to step 1700. Thereafter, in step 1800, the radio frequency power is turned off, in step 1900 the gas flow is terminated, and the chamber is evacuated and purged with inert gas. A determination is made in step 1950 as to whether the wafer should be further cleaned, in a clean and rinsing operation. If so, the wafer is cleaned in step 1975. Through use of reactive plasma to dissolve residues. After cleaning, or if cleaning is not required, the wafer is removed from the vacuum chamber and is ready for further processing.

The ion beam milling process of the invention may be utilized for treatment of polycrystalline and crystalline films, such as silicon, polysilicon, metals, metal oxides, and a wide variety of other compositions.

Figure 3:
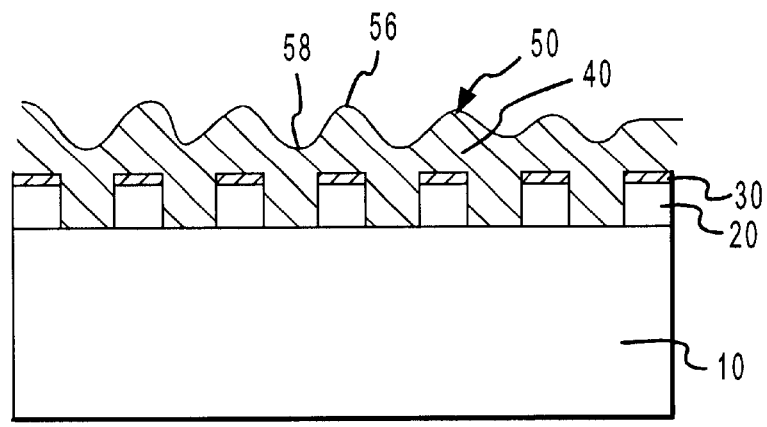
FIG. 3 is a cross-sectional view of a portion of a semiconductor wafer prior to processing in accordance with the methods of the invention.
Figure 4:
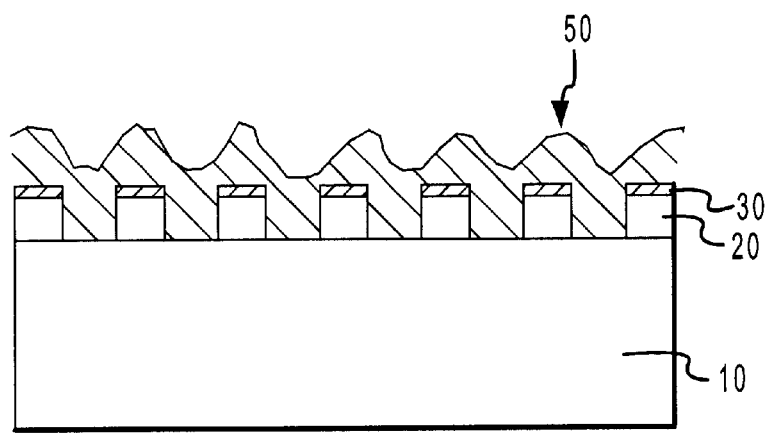
FIG. 4 is a cross-sectional view of a portion of a semiconductor wafer during processing in accordance with an embodiment of the method of the invention.
Figure 5:
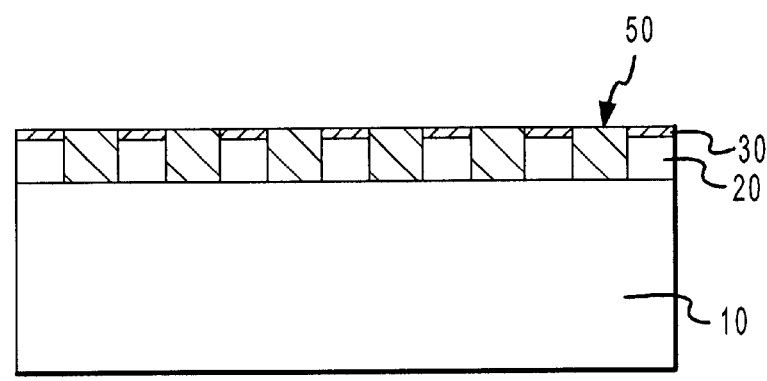
FIG. 5 is a cross-sectional view of a portion of a semiconductor wafer after processing in accordance with an embodiment of the method of the invention.

FIGS. 3, 4 and 5 depict representational, not-to-scale cross-sectional views of a portion of a silicon wafer prior to, during, and after ion beam milling in accordance with an embodiment of the invention. Before milling, the wafer portion 10 shown in FIG. 3 has a first patterned layer 20, shown as a series of spaced apart walls on its upper surface. Such a layer may be formed in a shallow trench isolation process (STI), or may result from the deposition of a conductive or nonconductive material. To assist in endpoint detection, or other aspects of the planarization or integration scheme, a stopper layer 30 overlies the upper surfaces of patterned layer 20. Such a stopper layer typically may be formed of a nitride, diamond-like carbon, or other materials well known in semiconductor fabrication. Finally, a conformal uppermost layer 40, requiring planarization, is deposited to cover both layers 20 and 30. Such a layer may be laid down by techniques such as chemical vapor deposition, physical vapor deposition, ion sputtering, or other useful methods. Layer 40 is most typically conformally deposited, so that the upper surface of layer 40 is non-planar and irregular in topology. Thus, as shown, the surface 50 of layer 40 may include several low lying features 58 and raised features 56. In order to proceed with further fabrication steps, the surface 50 must be planarized.

During milling in accordance with an embodiment of the invention, the topology of surface 50 becomes highly faceted by the effects of ion beam rastering and wafer bias as shown in FIG. 4. The formation, orientation, sizes and other parameters of the facets are properties of the materials from which layer 40 is created. For example, a polysilicon layer 40 will form facets that represent crystallographic planes of the small silicon crystals of the layer. In such a layer, the orientation of the facet will be randomly distributed, and different crystallographic plane surfaces typically will have different etch sputter rates. Scanning the surface with the ion beam will permit planarization of the surface, as long as the ion beam includes a rastering, focusing, and variable incident properties.

Upon completion of ion beam milling in accordance with the invention, a surface as shown in FIG. 5 is created. Thus, upper surface 50 of layer 40 is substantially planarized, and the irregular microstructures 58 and 56 shown in FIG. 3 are substantially eliminated.

The foregoing description provides an enabling disclosure of the invention, which is not limited by the description, but only by the scope of the appended claims. All those other aspects of the invention, and the equivalence, that will become apparent when a person of skill in the art has read the foregoing, all within the scope of the invention and of the claims hereinbelow.

I claim:

1. A method of planarizing the surface of a substrate having micro irregularities, the method comprising:

placing the substrate in a holder in a chamber of a radio frequency plasma generator, the surface to be planarized exposed to a source of ion beams;

filling the chamber with a gas and ionizing the gas with radio frequency energy to form a plasma surrounding the substrate;

directing an ion beam to scan the surface of the substrate to be planarized, the ion beam having sufficient energy to remove surface micro irregularities from the surface of the substrate;

checking the scanned surface of the substrate for surface smoothness characteristics; and removing the substrate when the checking indicates predetermined surface smoothness characteristics have been achieved.

2. The method of claim 1, wherein the filling of the chamber with a gas comprises filling with a gas selected from the group consisting of argon, krypton, helium, nitrogen fluoride and mixtures thereof.

3. The method of claim 1, wherein the ionizing of the gas with radio frequency energy comprises ionizing with energy in the range from about 3 kw to about 5 kw.

4. The method of claim 1, wherein the scanning comprises scanning with an ion beam having energy in the range from about 100 to about 1000 eV.

5. The method of claim 1, wherein the placing of the substrate in a holder comprises placing a semiconductor wafer in a holder.

6. The method of claim 1, wherein placing the substrate in a holder comprises placing an optical lens in the holder.

7. A method of planarizing the surface of a semiconductor wafer having micro irregularities, the method comprising:

placing the semiconductor wafer in a holder in a chamber of a radio frequency plasma generator, the surface to be planarized exposed to a source of ion beams;

filling the chamber with a gas and ionizing the gas with radio frequency energy to form a plasma surrounding the semiconductor wafer;

directing an ion beam to scan the surface of the semiconductor wafer to be planarized, the ion beam having sufficient energy to remove surface micro irregularities from the surface of the semiconductor wafer;

checking the scanned surface of the semiconductor wafer for surface smoothness characteristics; and removing the semiconductor wafer when the checking indicates predetermined surface smoothness characteristics have been achieved.

8. The method of claim 7, wherein the filling of the chamber with a gas comprises filling with a gas selected from the group consisting of argon, krypton, helium, nitrogen fluoride and mixtures thereof.

9. The method of claim 7, wherein the ionizing of the gas with radio frequency energy comprises ionizing with energy in the range from about 3 kw to about 5 kw.

10. The method of claim 7, wherein the scanning comprises scanning with an ion beam having energy in the range from about 100 to about 1000 eV.

11. A method of planarizing the surface of a substrate having micro irregularities, the method comprising:

immersing the substrate in a noble gas with the surface to be planarized exposed to a source of ion beams;

ionizing the gas with radio frequency energy to form a plasma surrounding the substrate;

scanning the surface of the substrate to be planarized with an ion beam, the ion beam having sufficient energy to remove surface micro irregularities from the surface of the substrate;

monitoring the scanned surface of the substrate for surface smoothness characteristics; and ceasing the scanning when the checking indicates predetermined surface smoothness characteristics have been achieved.

12. The method of claim 11, wherein the ionizing of the gas with radio frequency energy comprises ionizing with energy in the range from about 3 kw to 5 kw.

13. The method of claim 11, wherein the scanning comprises scanning with an ion beam having energy in the range from about 100 to about 1000 eV.

* * * * *